(12) United States Patent
Iwakoke

(10) Patent No.: US 11,140,766 B2
(45) Date of Patent: Oct. 5, 2021

(54) PLASMA CONTROL SYSTEM AND PLASMA CONTROL SYSTEM PROGRAM

(71) Applicant: NISSIN ELECTRIC CO., LTD., Kyoto (JP)

(72) Inventor: Tsubasa Iwakoke, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 0 days.

(21) Appl. No.: 16/982,047

(22) PCT Filed: Mar. 15, 2019

(86) PCT No.: PCT/JP2019/010802
§ 371 (c)(1),
(2) Date: Sep. 18, 2020

(87) PCT Pub. No.: WO2019/181777
PCT Pub. Date: Sep. 26, 2019

(65) Prior Publication Data
US 2021/0022236 A1     Jan. 21, 2021

(30) Foreign Application Priority Data
Mar. 20, 2018  (JP) .............................. JP2018-052234

(51) Int. Cl.
*H05H 1/46*     (2006.01)
*H01J 37/32*    (2006.01)

(52) U.S. Cl.
CPC ......... *H05H 1/46* (2013.01); *H01J 37/32183* (2013.01); *H01J 2237/327* (2013.01); *H05H 1/466* (2021.05); *H05H 1/4652* (2021.05)

(58) Field of Classification Search
None
See application file for complete search history.

(56) References Cited

U.S. PATENT DOCUMENTS

2015/0097480 A1   4/2015  Chung et al.

FOREIGN PATENT DOCUMENTS

| JP | 2004228354 | 8/2004 |
|---|---|---|
| JP | 2010157511 | 7/2010 |

(Continued)

OTHER PUBLICATIONS

"International Search Report (Form PCT/ISA/210)" of PCT/JP2019/010802, dated May 21, 2019, with English translation thereof, pp. 1-4.

*Primary Examiner* — Jany Richardson
(74) *Attorney, Agent, or Firm* — JCIPRNET

(57) ABSTRACT

A plasma control system comprises: a high frequency power source; a first antenna connected at one end to the high frequency power source; a second antenna connected at one end to another end of the first antenna; a first variable reactance element provided between the first antenna and the second antenna; a first drive part for the first variable reactance element; a second variable reactance element connected to another end of the second antenna; a second drive part for the second variable reactance element; a first current detection part detecting the current in the one end of the first antenna; a second current detection part detecting the current between the first antenna and the second antenna; a third current detection part detecting the current in the other end of the second antenna; and a control device controlling the first drive part and the second drive part.

7 Claims, 13 Drawing Sheets

(56) References Cited

FOREIGN PATENT DOCUMENTS

| | | |
|---|---|---|
| JP | 2012074200 | 4/2012 |
| JP | 2012074464 | 4/2012 |
| JP | 2013105543 | 5/2013 |
| JP | 2013161715 | 8/2013 |
| JP | 2015062181 | 4/2015 |
| JP | 2016138598 | 8/2016 |
| WO | WO-2021113111 A1 * | 6/2021 |

* cited by examiner

PLASMA CONTROL SYSTEM AND PLASMA CONTROL SYSTEM PROGRAM

CROSS-REFERENCE TO RELATED APPLICATION

This application is a 371 application of the International PCT application serial no. PCT/JP2019/010802, filed on Mar. 15, 2019, which claims the priority benefit of Japan Patent Application No. 2018-052234, filed on Mar. 20, 2018. The entirety of each of the abovementioned patent applications is hereby incorporated by reference herein and made a part of this specification.

TECHNICAL FIELD

The present disclosure relates to a plasma control system controlling an inductively-coupled plasma generated by causing a high frequency current to flow through an antenna and a program used for this plasma control system.

BACKGROUND ART

As illustrated in Patent Literature 1 (Japanese Patent Application Laid-Open No. 2004-228354), a plasma processing apparatus having a configuration in which an inductively-coupled plasma (abbreviated to ICP) is generated when a plurality of antennas are disposed in four directions with respect to a substrate inside a vacuum container, and a high-frequency current is caused to flow through such antennas is known.

Described in more detail, this plasma processing apparatus includes variable impedance elements connected to the plurality of antennas and pickup coils or capacitors disposed on power supply sides of the plurality of antennas. By performing feedback control of impedance values of the variable impedance elements on the basis of output values from the pickup coils or the capacitors, the density of the plasma generated in the vicinity of each of the antennas is controlled such that it is within a predetermined range, whereby spatial uniformization of a plasma density generated in the vacuum container can be achieved.

However, when the size of the substrate is large, a configuration in which relatively short antennas are disposed in four directions with respect to the substrate, which is as used in the plasma processing apparatus disclosed in Patent Literature 1, cannot be used. Thus, in such a case, long antennas as disclosed in Patent Literature 2 (Japanese Patent Application Laid-Open No. 2016-138598) are used.

In a case in which an inductively-coupled plasma is generated by disposing such long antennas inside a vacuum container, in accordance with electrostatic coupling occurring between the antennas and a plasma, a current is caused to flow between an antenna and the wall of the vacuum container through the plasma, or a current is caused to flow between antennas that are adjacent to each other through the plasma.

As a result, a distribution of the amounts of currents along the longitudinal directions of the antennas is not able to be uniformized, and there is a problem in that the density of the plasma along the longitudinal direction of the antennas is non-uniform.

SUMMARY OF INVENTION

The present disclosure has been realized for solving the problems described above, and it is desirable to generate a uniform plasma along the longitudinal directions of antennas while a large size of a substrate using long antennas can be handled.

In other words, a plasma control system according to the present disclosure includes: a high frequency power source; a first antenna configured to have one end connected to the high frequency power source; a second antenna configured to have one end connected to the other end of the first antenna; a first reactance variable element configured to be disposed between the first antenna and the second antenna and have a reactance changing in accordance with movement of a movable element; a first drive part configured to move the movable element of the first reactance variable element; a second reactance variable element configured to be connected to the other end of the second antenna and have a reactance changing in accordance with movement of a movable element; a second drive part configured to move the movable element of the second reactance variable element; a first current detecting part configured to detect a current flowing through one end of the first antenna; a second current detecting part configured to detect a current flowing between the first antenna and the second antenna; a third current detecting part configured to detect a current flowing through the other end of the second antenna; and a control apparatus configured to output control signals used for controlling the first drive part and the second drive part such that a first current value acquired by the first current detecting part, a second current value acquired by the second current detecting part, and a third current value acquired by the third current detecting part become the same.

According to such a plasma control system, the control apparatus outputs control signals used for controlling the first drive part and the second drive part such that the first current value, the second current value, and the third current value become the same, and therefore, currents flowing through the first antenna and the second antenna can be configured to be uniform as much as possible in a longitudinal direction.

As a result, a plasma that is uniform along the longitudinal direction of the antennas can be generated while an increase in size of a substrate using long antennas is able to be handled.

In addition, "the first current value, the second current value, and the third current value becoming the same" in the present disclosure has a meaning that also includes a case in which currents flowing through the first antenna and the second antenna are configured to be uniform as much as possible in a longitudinal direction, and an ignorable error or an undetectable error occurs in the first current value, the second current value, and the third current value in addition to a case in which the first current value, the second current value, and the third current value become the same.

As a specific configuration of the control apparatus for configuring the first current value, the second current value, and the third current value to be the same, there is a configuration including: a first comparison part configured to compare a first detection value with a second detection value; a second comparison part configured to compare the second detection value with a third detection value; and a control part configured to output a control signal used for controlling the first drive part such that the first current value and the second current value become the same on the basis of a result of the comparison performed by the first comparison part and output a control signal used for controlling the second drive part such that the second current value and the third current value become the same on the basis of a result of the comparison performed by the second comparison part.

According to such a configuration, the second current value and the third current value can be caused to be the same together with causing the first current value and the second current value to be the same, and, consequently, the first current value, the second current value, and the third current value can be configured to be the same.

As another configuration of the control apparatus, there is a configuration including: a pattern data storing part configured to store pattern data in which a plurality of types of reference current value patterns representing magnitude relations between the first current value, the second current value, and the third current value and control patterns that are set in advance in correspondence with the reference current value patterns and are used for controlling the first drive part and the second drive part such that the current values become the same are associated with each other; an actual current value pattern determining part configured to determine an actual current value pattern that is an actual magnitude relation between the first current value, the second current value, and the third current value; and a control part configured to determine the reference current value pattern corresponding to the actual current value pattern and output control signals used for controlling the first drive part and the second drive part on the basis of the control pattern associated with the reference current value pattern.

According to such a configuration, by outputting control signals used for controlling the first drive part and the second drive part on the basis of a control pattern corresponding to an actual current value pattern, the first current value, the second current value, and the third current value can be caused to be the same.

In a configuration in which the first antenna and the second antenna penetrate side walls, which face each other, of a vacuum container housing a substrate and are connected in series using a connection conductor interposed between ends of the antennas on the same side, in a case in which a reactance of each reactance element is changed, a variation in the second current value is smaller than variations in the first current value and the third current value. It is assumed that the reason for this is that it is unlikely that a current flowing between the first antenna and the second antenna will be influenced by the plasma more than a current flowing through each of the antennas.

Thus, it is preferable that the control apparatus should be configured to output a control signal used for controlling the first drive part such that the first current value approaches the second current value in a case in which the first current value and the second current value are different from each other and output a control signal used for controlling the second drive part such that the third current value approaches the second current value in a case in which the second current value and the third current value are different from each other.

According to such a configuration, the first current value and the third current value are caused to approach the second current value that is relatively stable, and therefore, the first current value, the second current value, and the third current value can be caused to be the same in a relatively short time.

As the first reactance variable element, there is a variable capacitor including a first fixed electrode configured to be electrically connected to the first antenna, a second fixed electrode configured to be electrically connected to the second antenna, and a movable electrode that is the movable element configured to form a first capacitor with the first fixed electrode and form a second capacitor with the second fixed electrode, and the variable capacitor is configured to be able to change a static capacitance by rotating the movable electrode around a predetermined rotation axis. In such a configuration, for example, in a state in which a static capacitance is zero, in other words, the movable electrode and each of the fixed electrodes do not overlap each other in a plan view, when a gap between the movable electrode and each fixed electrode is formed, an arc discharge may occur in the gap, and there is concern that the capacitor may be damaged. Thus, in the configuration described above, it is preferable that the control apparatus should include a control stopping part that stops rotation of the movable electrode in a case in which a rotation angle of the movable electrode becomes a predetermined threshold. According to such a configuration, the rotation of the movable electrode can be stopped before a rotation angle for which an arc discharge may occur is reached, and generation of an arc discharge can be prevented.

It is preferable that the first antenna and the second antenna penetrate side walls, which face each other, of a vacuum container housing a substrate and be connected in series using a connection conductor interposed between ends of the antennas on the same side, and each of the antennas have a flow passage through an inside of which a coolant flows, the connection conductor including: a first variable capacitor that is the first reactance variable element; a first connection part configured to connect the first variable capacitor and an end of the first antenna and lead the coolant flowing out from an opening portion formed at the end to the first variable capacitor; and a second connection part configured to connect the first variable capacitor and an end of the second antenna and lead the coolant that has passed through the first variable capacitor to an opening portion formed at the end, and the coolant being a dielectric of the first variable capacitor.

According to such a configuration, when simply described, a reactance for a high frequency current is acquired by subtracting the capacitive reactance of the first variable capacitor from the inductive reactance of the antennas, and accordingly, the impedance of the antennas can be reduced while connecting one pair of antennas in series. As a result, even in a case in which the antennas are configured to be long, an increase in the impedance can be inhibited, and high frequency currents can easily flow through the antennas, and a plasma can be generated with a high efficiency. In addition, since the coolant of the antennas is used as a dielectric of the first variable capacitor, unexpected variations in the static capacitance can be inhibited while cooling the first variable capacitor.

In addition, a plasma control system program according to the present disclosure is a program that is used in a plasma control system including: a high frequency power source; a first antenna configured to have one end connected to the high frequency power source; a second antenna configured to have one end connected to the other end of the first antenna; a first reactance variable element configured to be disposed between the first antenna and the second antenna and have a reactance changing in accordance with movement of a movable element; a first drive part configured to move the movable element of the first reactance variable element; a second reactance variable element configured to be connected to the other end of the second antenna and have a reactance changing in accordance with movement of a movable element; a second drive part configured to move the movable element of the second reactance variable element; a first current detecting part configured to detect a current flowing through one end of the first antenna; a second current detecting part configured to detect a current flowing between the first antenna and the second antenna; and a third current detecting part configured to detect a current flowing through the other end of the second antenna and cause a computer to exhibit a function of outputting control signals used for controlling the first drive part and the second drive part such that a first current value acquired by the first current detecting part, a second current value acquired by the second current detecting part, and a third current value acquired by the third current detecting part become the same.

According to such a plasma control system program, operations and effects that are similar to those of the plasma control system described above can be acquired.

According to the present disclosure configured in this way, a uniform plasma can be generated along longitudinal directions of antennas while a large size of a substrate using long antennas can be handled.

DESCRIPTION OF EMBODIMENTS

Figure 1:
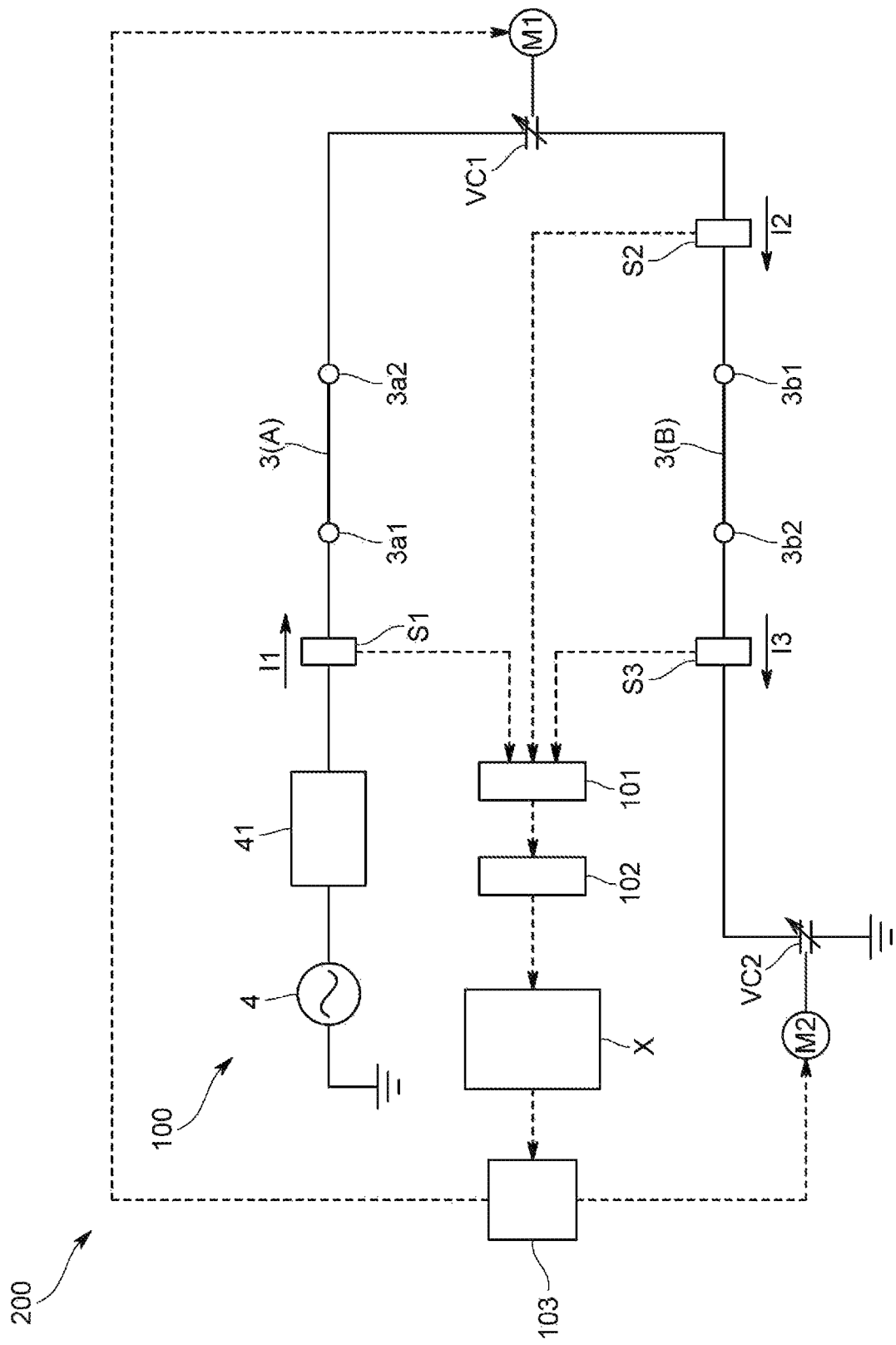
FIG. 1 is a schematic view illustrating the configuration of a plasma control system according to this embodiment.

Hereinafter, plasma control systems according to an embodiment of the present disclosure will be described with reference to the drawings.
<System Configuration>
A plasma control system 200 according to this embodiment, as illustrated in FIG. 1, at least includes a plasma processing apparatus 100 performing processing on a substrate using an inductively-coupled plasma and a control apparatus X used for controlling the plasma.

First, the plasma processing apparatus 100 will be described.

Figure 2:
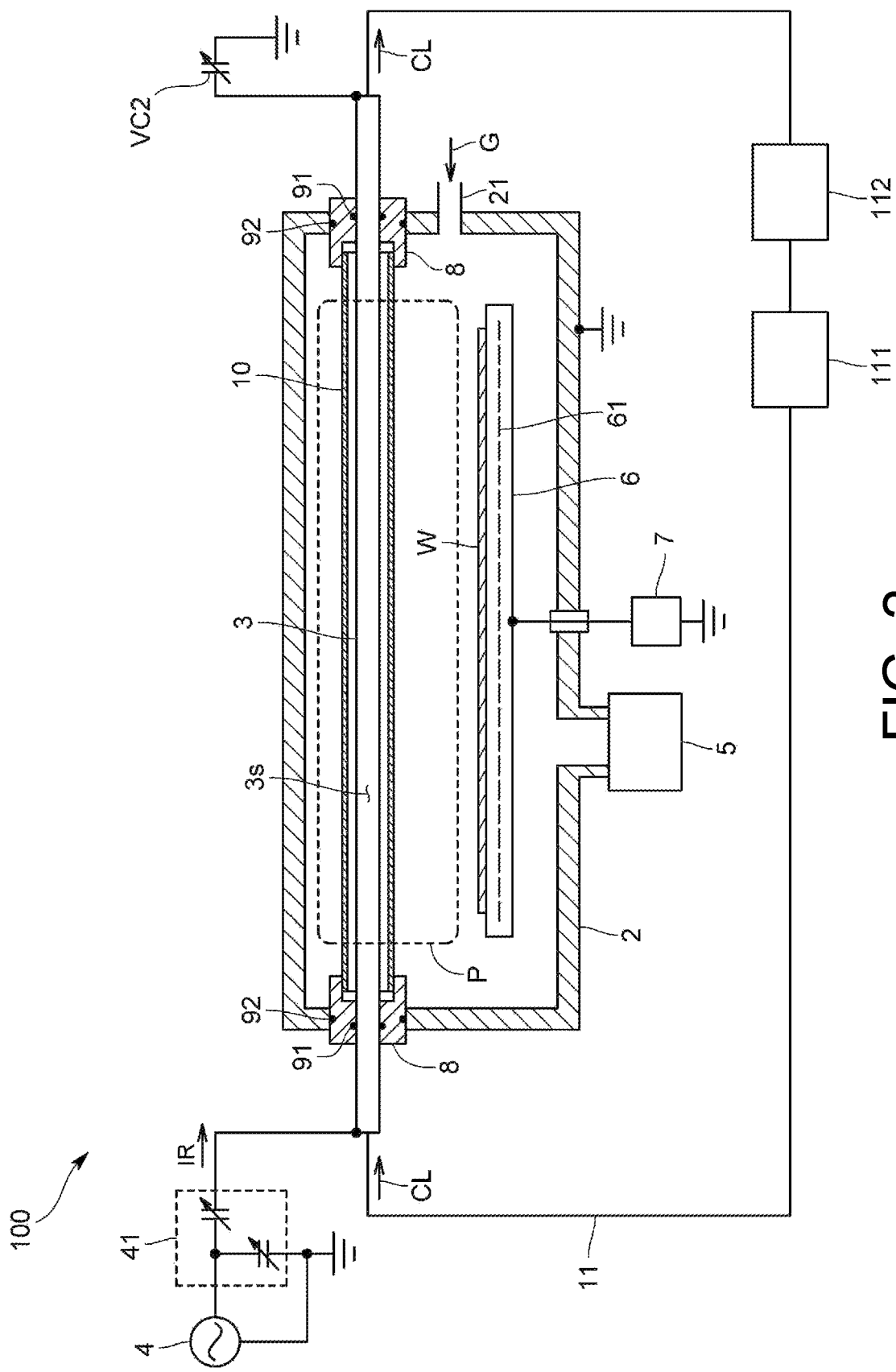
FIG. 2 is a longitudinal sectional view schematically illustrating the configuration of a plasma processing apparatus according to the embodiment.

The plasma processing apparatus 100, for example, as illustrated in FIG. 2, performs processing such as film forming, etching, ashing, sputtering, and the like using a plasma CVD method on a substrate W. The substrate W, for example, is a substrate for a flat panel display (FPD) such as a liquid crystal display or an organic EL display, a flexible substrate for a flexible display, or the like.

In addition, this plasma processing apparatus 100 is also called a plasma CVD device in a case in which film forming is performed using a plasma CVD method, is also called a plasma etching device in a case in which etching is performed, is also called a plasma ashing device in a case in which ashing is performed, and is also called a plasma sputtering device in a case in which sputtering is performed.

More specifically, the plasma processing apparatus 100 includes a vacuum container 2 which is exhausted to a vacuum and into which a gas G is introduced, long antennas 3 disposed inside the vacuum container 2, and a high frequency power source 4 that applies high-frequency waves, which is used for generating an inductively-coupled plasma P inside the vacuum container 2, to the antennas 3. In addition, by applying high-frequency waves from the high frequency power source 4 to the antennas 3, high frequency currents IR flow through the antennas 3, and an induced electric field is generated inside the vacuum container 2, whereby an inductively coupled plasma P is generated.

The vacuum container 2, is, for example, a container made of metal and has an inside that is exhausted to a vacuum by a vacuum evacuation device 5. In this example, the vacuum container 2 is electrically grounded.

A gas G is introduced into the inside of the vacuum container 2 through a flow rate regulator (not illustrated in the drawing) and a gas introduction port 21 formed on a side wall of the vacuum container 2. The gas G may correspond to details of processing performed on the substrate W.

In addition, a substrate holder 6 holding the substrate W is provided inside the vacuum container 2. As in this example, a bias voltage may be applied from a bias power source 7 to the substrate holder 6. The bias voltage, for example, is a negative DC voltage, a negative pulse voltage, or the like but is not limited thereto. For example, by controlling an energy at a time when positive ions in the plasma P are incident to the substrate W using such a bias voltage, control of a degree of crystallization of a film formed on the surface of the substrate W and the like can be performed. A heater 61 that heats the substrate W may be provided inside the substrate holder 6.

A plurality of antennas 3 have a linear shape and are disposed along the surface of the substrate W (for example, substantially parallel to the surface of the substrate W) above the substrate W inside the vacuum container 2.

Parts of each of the antennas 3 near both ends penetrate through side walls of the vacuum container 2 that face each other. Insulating members 8 are disposed in parts through which both ends of the antenna 3 penetrate outside of the vacuum container 2. Both ends of the antenna 3 penetrate through these insulating members 8, and penetration portions thereof are vacuum sealed, for example, by packings 91. A space between each of the insulating members 8 and the vacuum container 2 is also vacuum sealed by a packing 92. For example, the material of the insulating member 8 may be a ceramic such as alumina, quartz, engineering plastics such as polyphenylene sulfide (PPS), or polyetheretherketone (PEEK), or the like.

In addition, a portion of the antenna 3 that is positioned inside the vacuum container 2 is covered with an insulating cover 10 having a straight tubular shape. Both ends of this insulating cover 10 are supported by the insulating members 8. In addition, for example, the material of the insulating cover 10 is quartz, alumina, a fluororesin, silicon nitride, silicon carbide, silicon, or the like.

Each of the plurality of antennas 3 has a hollow structure having a flow passage 3s through which a coolant CL circulates on the inside thereof. In this embodiment, the antenna is a metal pipe having a straight tubular shape. For example, the material of the metal pipe is copper, aluminum, an alloy thereof, stainless steel, or the like.

In addition, the coolant CL circulates through the antennas 3 using a circulation flow passage 11 disposed outside the vacuum container 2, and a temperature control mechanism 111 such as a heat exchanger for adjusting the coolant CL such that it has a constant temperature and a circulation mechanism 112 such as a pump for circulating the coolant CL in the circulation flow passage 11 are disposed in the circulation flow passage 11 described above. As the coolant CL, from the viewpoint of electric insulation, water having high resistance is preferable, and, for example, pure water or water similar thereto is preferable. Other than that, for example, a liquid refrigerant other than water such as a fluorine-based inert liquid may be used.

Figure 3:
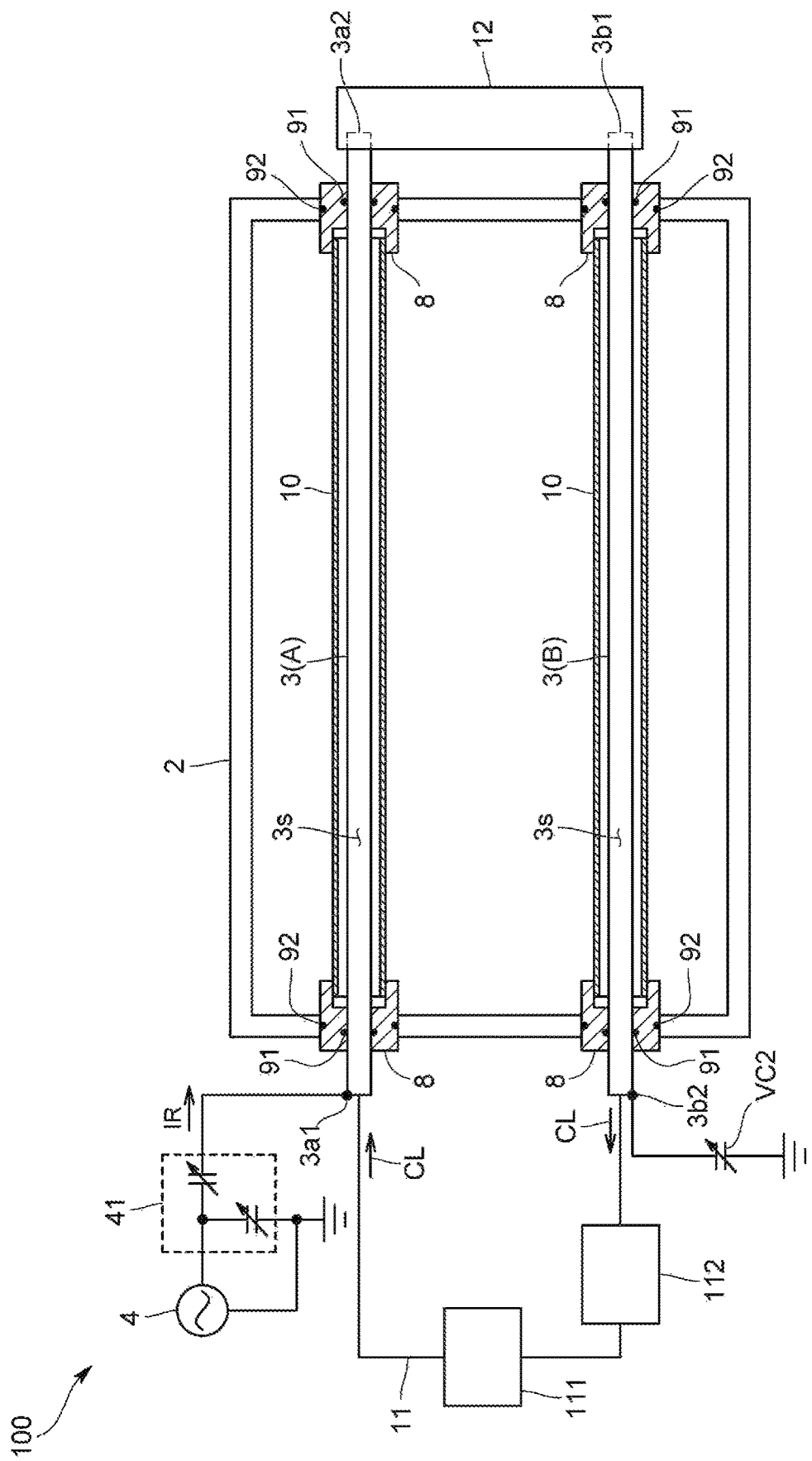
FIG. 3 is a vertical sectional view schematically illustrating the configuration of the plasma processing apparatus according to the embodiment.

In addition, as illustrated in FIG. 3, a plurality of antennas 3 are connected using the connection conductor 12 and are configured to form a single antenna structure. In other words, ends of the antennas 3, which are adjacent to each other, extending to the outside of the vacuum container 2 are electrically connected using the connection conductor 12. Described in more detail, in this embodiment, two antennas 3 are connected using the connection conductor 12, and an end of one antenna 3 (hereinafter, also referred to as a first antenna 3A) and an end of the other antenna 3 (hereinafter, referred to as a second antenna 3B) are electrically connected.

Here, the ends of the first antenna 3A and the second antenna 3B connected using the connection conductor 12 are ends that are positioned on the same side wall side. In this way, high frequency currents IR in opposite directions flow through the first antenna 3A and the second antenna 3B.

The connection conductor 12 has a flow passage thereinside and is configured such that the coolant CL flows through the flow passage. More specifically, one end of the connection conductor 12 communicates with a flow passage of the first antenna 3A, and the other end of the connection conductor 12 communicates with a flow passage of the second antenna 3B. In this way, in the antennas 3A and 3B that are adjacent to each other, the coolant CL that has flowed through the first antenna 3A flows through the second antenna 3B via the flow passage of the connection conductor 12. In accordance with this, the plurality of antennas 3 can be cooled using the common coolant CL. In addition, since the plurality of antennas 3 can be cooled using one flow passage, the configuration of the circulation flow passage 11 can be simplified.

Out of the antennas 3A and 3B, an end of one antenna that is not connected using the connection conductor 12 (here, one end of the first antenna 3A) is a power supply side end 3a1, and a high frequency power source 4 is connected to the power supply side end 3a1 through a matching circuit 41. In addition, a terminal end 3b2 that is an end of the other side (here, the other end of the second antenna 3B) is grounded through a variable capacitor VC2. In addition, regarding the variable capacitor VC2, although various configurations may be used, as one example, the variable capacitor VC2 may be configured such that a fixed electrode (not illustrated in the drawing) and a movable electrode (not illustrated in the drawing) that forms a capacitor with the fixed electrode are included, and the static capacitance thereof can be changed by rotating the movable electrode around a predetermined rotation axis.

According to the configuration described above, high frequency currents IR can be caused to flow from the high frequency power source 4 to the antennas 3 through the matching circuit 41. For example, the frequency of high frequency waves is generally 13.56 MHz but is not limited thereto.

<Configuration of Connection Conductor 12>

Figure 4:
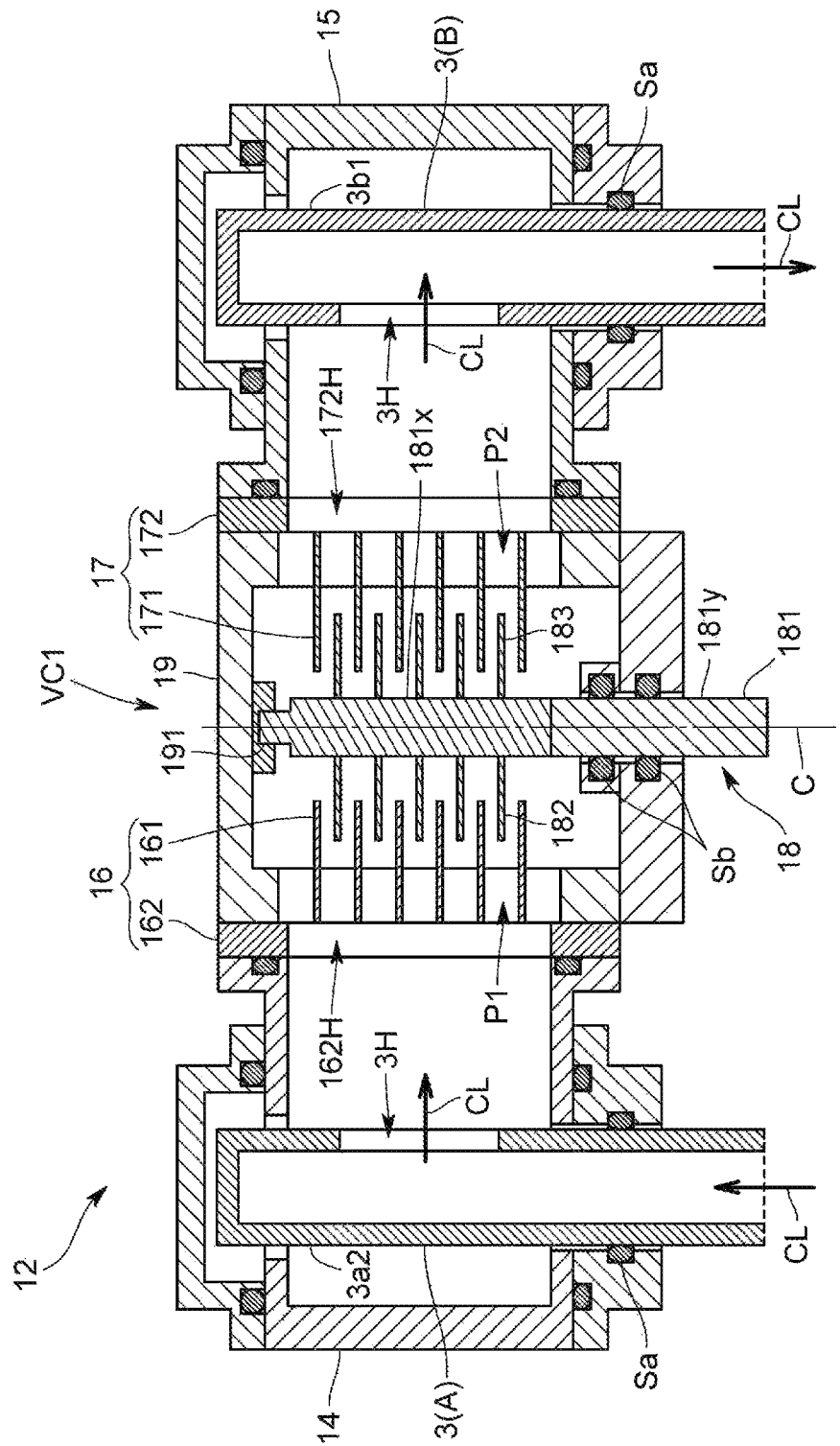
FIG. 4 is a vertical sectional view schematically illustrating a connection conductor according to the embodiment.
Figure 5:
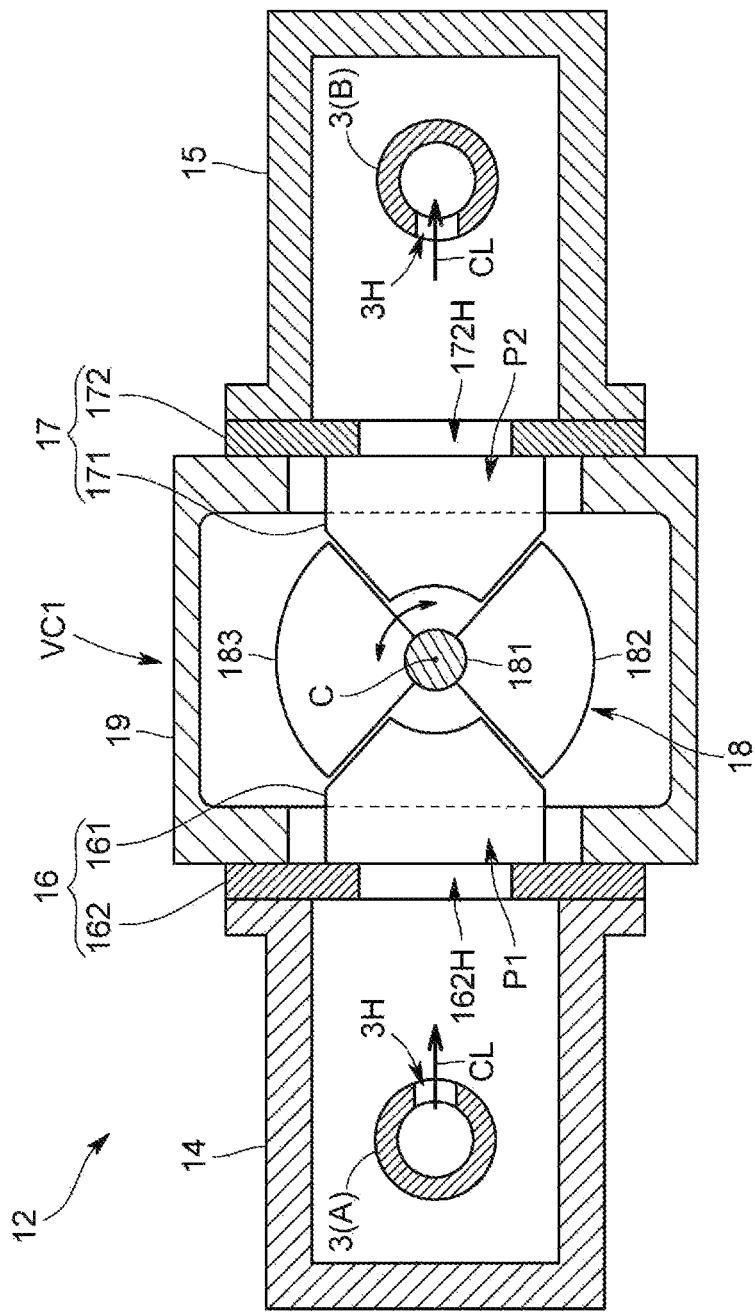
FIG. 5 is a longitudinal sectional view schematically illustrating the connection conductor according to the embodiment.

Next, the connection conductor 12 will be described in detail with reference to FIGS. 4 to 8. In FIGS. 4 and 5 and the like, some parts such as a sealing member and the like are omitted.

As illustrated in FIGS. 4 and 5, the connection conductor 12 has a variable capacitor VC1 that is electrically connected to the antennas 3A and 3B, a first connection part 14 that connects the variable capacitor VC1 and the other end 3a2 of the first antenna 3A, and a second connection part 15 that connects the variable capacitor VC1 and one end 3b1 of the second antenna 3B. In addition, in order to distinguish this variable capacitor VC1 and the variable capacitor VC2 connected to the terminal end 3b2 of the second antenna 3B illustrated in FIGS. 1 and 2 from each other, hereinafter, the former will be referred to as a first variable capacitor VC1, and the latter will be referred to as a second variable capacitor VC2.

By enclosing the other end 3a2 of the first antenna 3A, the first connection part 14 is brought into electrical contact with the antenna 3A and guides a coolant CL from an opening portion 3H formed at the other end 3a2 of the antenna 3A to the first variable capacitor VC1.

By enclosing the one end 3b1 of the second antenna 3B, the second connection part 15 is brought into electrical contact with the antenna 3B and guides the coolant CL that has passed through the first variable capacitor VC1 to an opening portion 3H formed at the one end 3b1 of the antenna 3B.

For example, the material of such connection parts 14 and 15 is copper, aluminum, an alloy thereof, stainless steel, or the like.

Each of the connection parts 14 and 15 according to this embodiment is mounted on the end of the antenna 3 via a sealing member Sa such as an O ring on the side of the vacuum container 2 with respect to the opening portion 3H to be liquid tight and is configured not to restrict a side outward from the opening portion 3H (see FIG. 4). In accordance with this, a configuration allowing slight inclinations of the antennas 3 with respect to the connection parts 14 and 15 may be employed.

The first variable capacitor VC1 includes a first fixed electrode 16 that is electrically connected to the first antenna 3A, a second fixed electrode 17 that is electrically connected to the second antenna 3B, and a movable electrode 18 that is a movable element forming a first capacitor with the first fixed electrode 16 and forming a second capacitor with the second fixed electrode 17.

The first variable capacitor VC1 according to this embodiment is configured to be able to change a static capacitance by rotating the movable electrode 18 around a predetermined rotation axis C. The first variable capacitor VC1 includes an insulating housing container 19 that houses the first fixed electrode 16, the second fixed electrode 17, and the movable electrode 18.

The housing container 19 includes an inlet port P1 that allows introduction of a coolant CL from the first antenna 3A and an outlet port P2 that leads the coolant CL out to the second antenna 3B. The inlet port P1 is formed on one side wall (a left wall in FIG. 4) of the housing container 19, the outlet port P2 is formed on the other side wall (a right wall in FIG. 4) of the housing container 19, and the inlet port P1 and the outlet port P2 are disposed at mutually opposing positions. In addition, although the housing container 19 according to this embodiment forms an approximately rectangular parallelepiped shape having a hollow part inside, the shape may be any other shape.

The first fixed electrode 16 and the second fixed electrode 17 are disposed at mutually different positions around the rotation axis C of the movable electrode 18. In this embodiment, the first fixed electrode 16 is disposed by being inserted into the inside of the housing container 19 from the inlet port P1 of the housing container 19. In addition, the second fixed electrode 17 is disposed by being inserted into the inside of the housing container 19 from the outlet port P2 of the housing container 19. In this way, the first fixed electrode 16 and the second fixed electrode 17 are disposed at positions that are symmetrical with respect to the rotation axis C.

Figure 6:
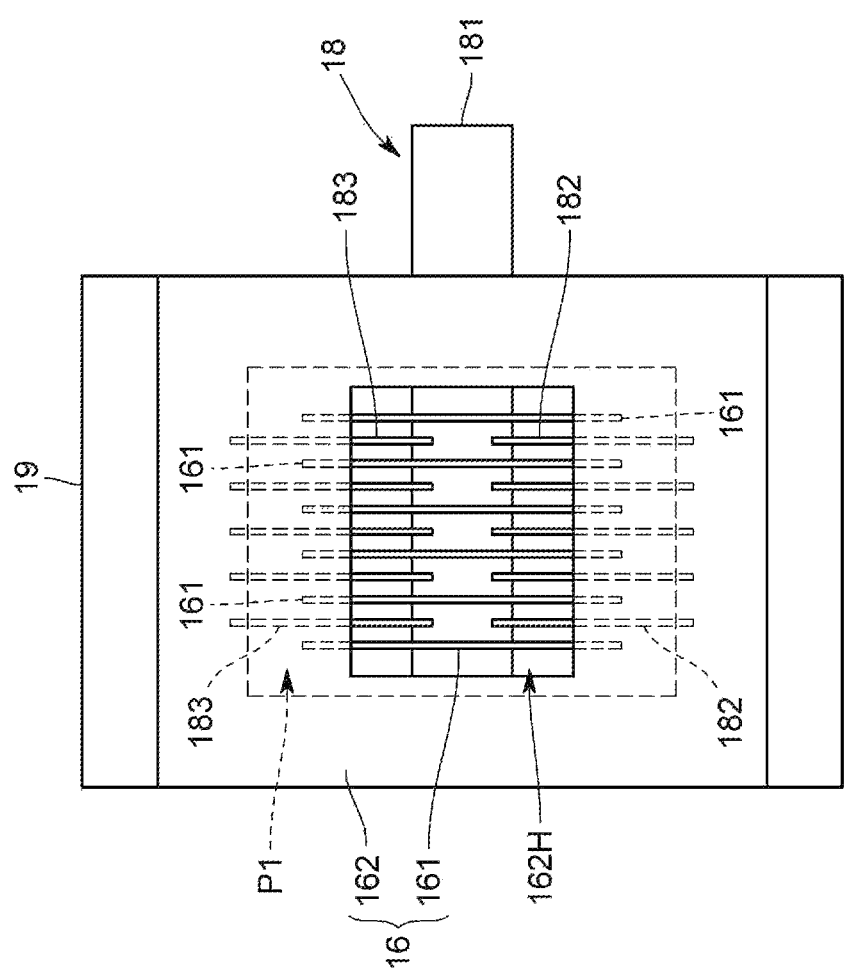
FIG. 6 is a side view of a variable capacitor according to the embodiment seen from an inlet port side.

As illustrated in FIGS. 5 and 6, the first fixed electrode 16 includes a plurality of first fixed metal plates 161 disposed to face each other. In addition, the second fixed electrode 17 includes a plurality of second fixed metal plates 171 disposed to face each other. These fixed metal plates 161 and 171 are disposed along the rotation axis C at approximately uniform intervals.

The plurality of first fixed metal plates 161 form the same shapes and are supported by a first flange member 162. The first flange member 162 is fixed to the left wall on which the inlet port P1 of the housing container 19 is formed. Here, a through hole 162H communicating with the inlet port P1 is formed in the first flange member 162. In addition, the plurality of second fixed metal plates 171 form the same shapes and are supported by a second flange member 172. The second flange member 172 is fixed to the right wall on which the outlet port P2 of the housing container 19 is formed. Here, a through hole 172H communicating with the outlet port P2 is formed in the second flange member 172. The plurality of first fixed metal plates 161 and the plurality of second fixed metal plates 171 are disposed at positions that are symmetrical with respect to the rotation axis C in a state being fixed to the housing container 19.

Figure 7:
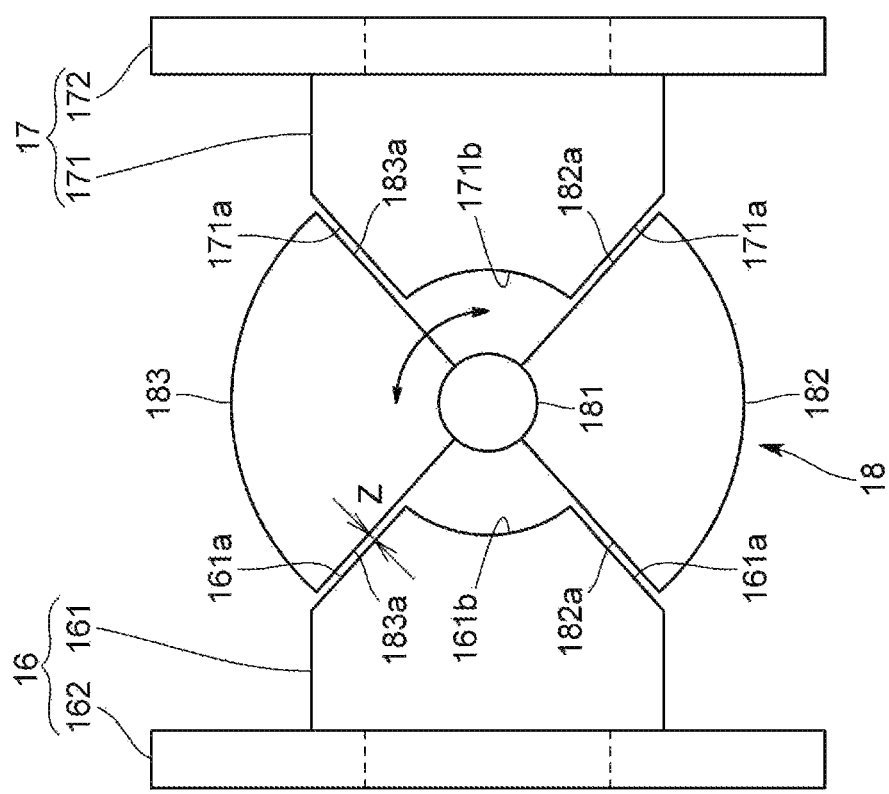
FIG. 7 is a schematic view illustrating a state in which a fixed metal plate and a movable metal plate according to the embodiment do not face each other.

In addition, each of the first fixed metal plates 161 and the second fixed metal plates 171 form a flat plate shape and, as illustrated in FIG. 7, having a shape of which a width decreases toward the rotation axis C in a plan view. In the respective fixed metal plates 161 and 171, end sides 161a and 171a with a smaller size are formed in a radial direction from the rotation axis C. In addition, an angle formed by the end sides 161a and 171a facing each other is 90 degrees. In addition, front end sides 161b and 171b of the fixed metal plates 161 and 171 on the rotation axis C side form arc shapes.

As illustrated in FIGS. 4 and 5, the movable electrode 18 includes a rotation shaft body 181 that is axially supported on a side wall (a front wall in FIG. 4) of the housing container 19 to be rotatable around the rotation axis C, a first movable metal plate 182 that is supported by the rotation shaft body 181 and faces the first fixed electrode 16, and a second movable metal plate 183 that is supported by the rotation shaft body 181 and faces the second fixed electrode 17.

The rotation shaft body 181 forms a linear shape that extends along the rotation axis C. This rotation shaft body 181 is configured such that one end thereof extends from a front wall of the housing container 19 to the outside. The rotation shaft body 181 is rotatably supported by a sealing member Sb such as an O ring on the front wall of this housing container 19. Here, the rotation shaft body 181 is supported at two points by two O rings on the front wall. In addition, the other end of the rotation shaft body 181 is brought into contact with a positioning concave part 191 disposed on an inner face of the housing container 19 to be rotatable.

In the rotation shaft body 181, a part 181x supporting the first movable metal plate 182 and the second movable metal plate 183 is formed from a conductive material such as a metal, and a part 181y extending from the housing container 19 to the outside is formed from an insulating material such as a resin.

A plurality of first movable metal plates 182 are disposed in correspondence with the first fixed metal plates 161. The first movable metal plates 182 form the same shapes. In addition, a plurality of second movable metal plates 183 are disposed in correspondence with the second fixed metal plates 171. The second movable metal plates 183 form the same shapes. These movable metal plates 182 and 183 are respectively disposed at approximately uniform intervals along the rotation axis C. In addition, in this embodiment the movable metal plates 182 and 183 are configured to be interposed between the fixed metal plates 161 and 171. In FIG. 4, although six fixed metal plates 161 and 171 are illustrated, and five movable plates 182 and 183 are illustrated, the configuration is not limited thereto. In addition, for example, each of gaps between the movable metal plates 182 and 183 and the fixed metal plates 161 and 171 is 1 mm.

As illustrated in FIG. 5, the first movable metal plates 182 and the second movable metal plates 183 are disposed at positions that are symmetrical with respect to the rotation axis C and form the same shapes. More specifically, as illustrated in FIG. 7, the movable metal plates 182 and 183 form a fan shape opening portion outward in the radial direction from the rotation axis C in a plan view. In this embodiment, a fan-shape having a center angle of 90 degrees is formed.

Figure 8:
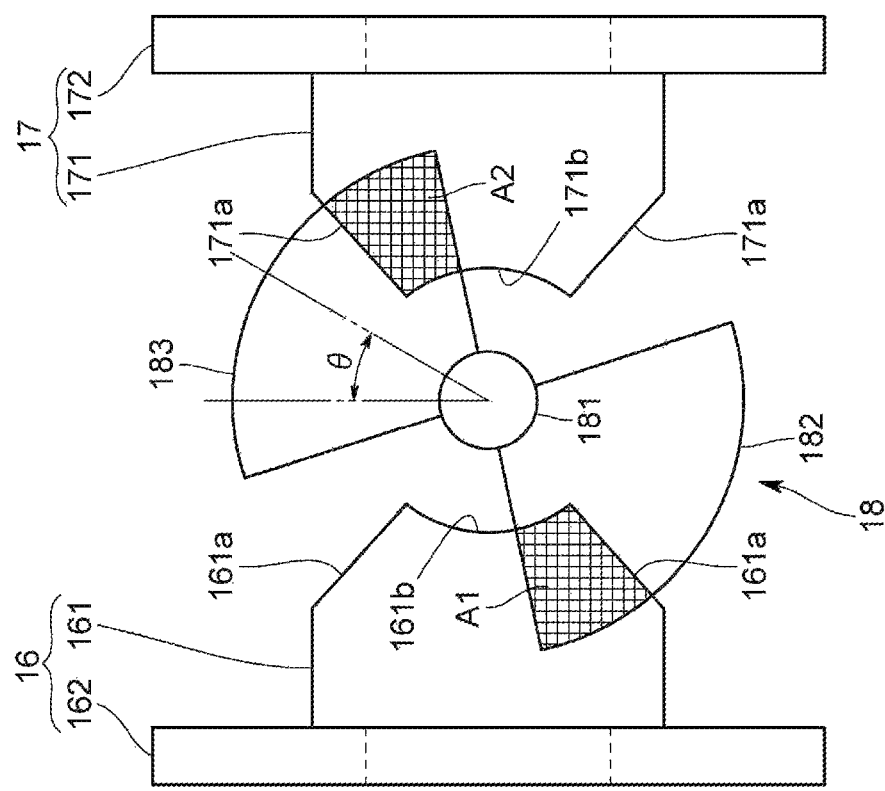
FIG. 8 is a schematic view illustrating a state in which the fixed metal plate and the movable metal plate according to the embodiment face each other.

In the first variable capacitor VC1 configured in this way, by rotating the movable electrode 18, as illustrated in FIG. 8, a facing area between the first fixed metal plate 161 and the first movable metal plate 182 (a first facing area A1) changes, and a facing area between the second fixed metal plate 171 and the second movable metal plate 183 (the second facing area A2) changes. In this embodiment, the first facing area A1 and the second facing area A2 change in the same manner. In addition, the front end sides 161b and 171b of the fixed metal plates 161 and 171 on the rotation axis C side have arc shapes, and, by rotating the movable electrode 18, the first facing area A1 and the second facing area A2 change in proportion to the rotation angle θ of the movable electrode 18.

In this embodiment, as illustrated in FIG. 7, in the plan view, gaps Z are formed between the end sides 182a and 183a of the movable metal plates 182 and 183, which open outward, and the end sides 161a and 171a of the fixed metal plates 161 and 171, which decrease in size, in a state in which the fixed metal plates 161 and 171 and the movable metal plates 182 and 183 do not face each other. In accordance with this, the movable electrode 18 can be detached in the axial direction of the movable electrode 18. In this embodiment, by detaching the front wall that supports the movable electrode 18 along the axial direction, the movable electrode 18 is detached.

In the configuration described above, when a coolant CL flows in from the inlet port P1 of the housing container 19, the inside of the housing container 19 is filled with the coolant CL. At this time, a space between the first fixed metal plate 161 and the first movable metal plate 182 is filled with the coolant CL, and a space between the second fixed metal plate 171 and the second movable metal plate 183 is filled with the coolant CL. In accordance with this, the coolant CL serves as a dielectric of the first capacitor and a dielectric of the second capacitor. In this embodiment, the static capacitance of the first capacitor and the static capacitance of the second capacitor are equal. In addition, the first capacitor and the second capacitor configured in this way are connected in series, and the static capacitance of the first variable capacitor VC1 is half the static capacitance of the first capacitor (or the second capacitor).

Here, in this embodiment, a direction in which the first fixed electrode 16 and the second fixed electrode 17 face the movable electrode 18 is configured to be orthogonal to a direction in which the inlet port P1 and the outlet port P2 face each other. In other words, the fixed metal plates 161 and 171 and the movable metal plates 182 and 183 are disposed along the direction in which the inlet port P1 and the outlet port P2 face each other. According to this configuration, the coolant CL can easily flow through the inside of the housing container 19. As a result, the coolant CL disposed inside the housing container 19 can be easily replaced, and the first variable capacitor VC1 can be cooled with a high efficiency. In addition, a coolant CL that has flowed in from the inlet port P1 can easily flow into a space between the fixed metal plates 161 and 171 and the movable metal plates 182 and 183 and can easily flow out from a space between the fixed metal plates 161 and 171 and the movable metal plates 182 and 183. As a result, a coolant disposed between the fixed metal plates 161 and 171 and the movable metal plates 182 and 183 can be easily replaced, and change in temperature of the coolant CL serving as a dielectric is inhibited. In accordance with this, the static capacitance of the first variable capacitor VC1 can be easily maintained constant. In addition, it becomes difficult for air bubbles to remain between the fixed metal plates 161 and 171 and the movable metal plates 182 and 183.

As illustrated in FIG. 1, the plasma control system 200 according to this embodiment further includes a first current detecting part S1 that detects a current flowing though the one end $3a1$ (in other words, the power supply side end $3a1$ described above) of the first antenna 3A, a second current detecting part S2 that detects a current flowing between the first antenna 3A and the second antenna 3B, a third current detecting part S3 that detects a current flowing through the other end $3b2$ (in other words, the terminal end $3b2$ described above) of the second antenna 3B, and a control apparatus X that controls the first variable capacitor VC1 and the second variable capacitor VC2. In addition, for the convenience of description, in FIG. 1, illustration of structures in the vicinity of the antenna 3 such as the vacuum container 2 and the like is omitted.

The first current detecting part S1, for example, is a current monitor such as a current transformer that is attached to the one end $3a1$ of the first antenna 3A or in the vicinity thereof. A detection signal detected by the first current detecting part S1 is converted from an AC to a DC by a DC conversion circuit 101, is converted from an analog signal to a digital signal by an AD converter 102, and is output to the control apparatus X.

The second current detecting part S2, for example, is a current monitor such as a current transformer that is disposed between the first variable capacitor VC1 and the one end $3b1$ of the second antenna 3B. A detection signal detected by the second current detecting part S2 is converted from an AC to a DC by the DC conversion circuit 101, is converted from an analog signal to a digital signal by the AD converter 102, and is output to the control apparatus X. In addition, the second current detecting part S2 may be disposed between the other end $3a2$ of the first antenna 3A and the first variable capacitor VC1 and output a detection signal corresponding to the magnitude of a current flowing through the other end $3a2$ of the first antenna 3A.

The third current detecting part S3, for example, is a current monitor such as a current transformer that is attached to the other end $3b2$ of the second antenna 3B or in the vicinity thereof. A detection signal detected by the third current detecting part S3 is converted from an AC to a DC by the DC conversion circuit 101, is converted from an analog signal to a digital signal by the AD converter 102, and is output to the control apparatus X.

The control apparatus X controls the static capacitance of the first variable capacitor VC1 and the static capacitance of the second variable capacitor VC2. Here, as illustrated in FIG. 1, the movable electrode 18 of the first variable capacitor VC1 is driven by a motor that is a first drive part M1, and a movable element, which is not illustrated in the drawing, of the second variable capacitor VC2 is driven by a motor that is a second drive part M2. The motors M1 and M2 are rotated in accordance with drive signals supplied from a motor driving circuit 103, and this motor driving circuit 103 is controlled by the control apparatus X.

Figure 9:
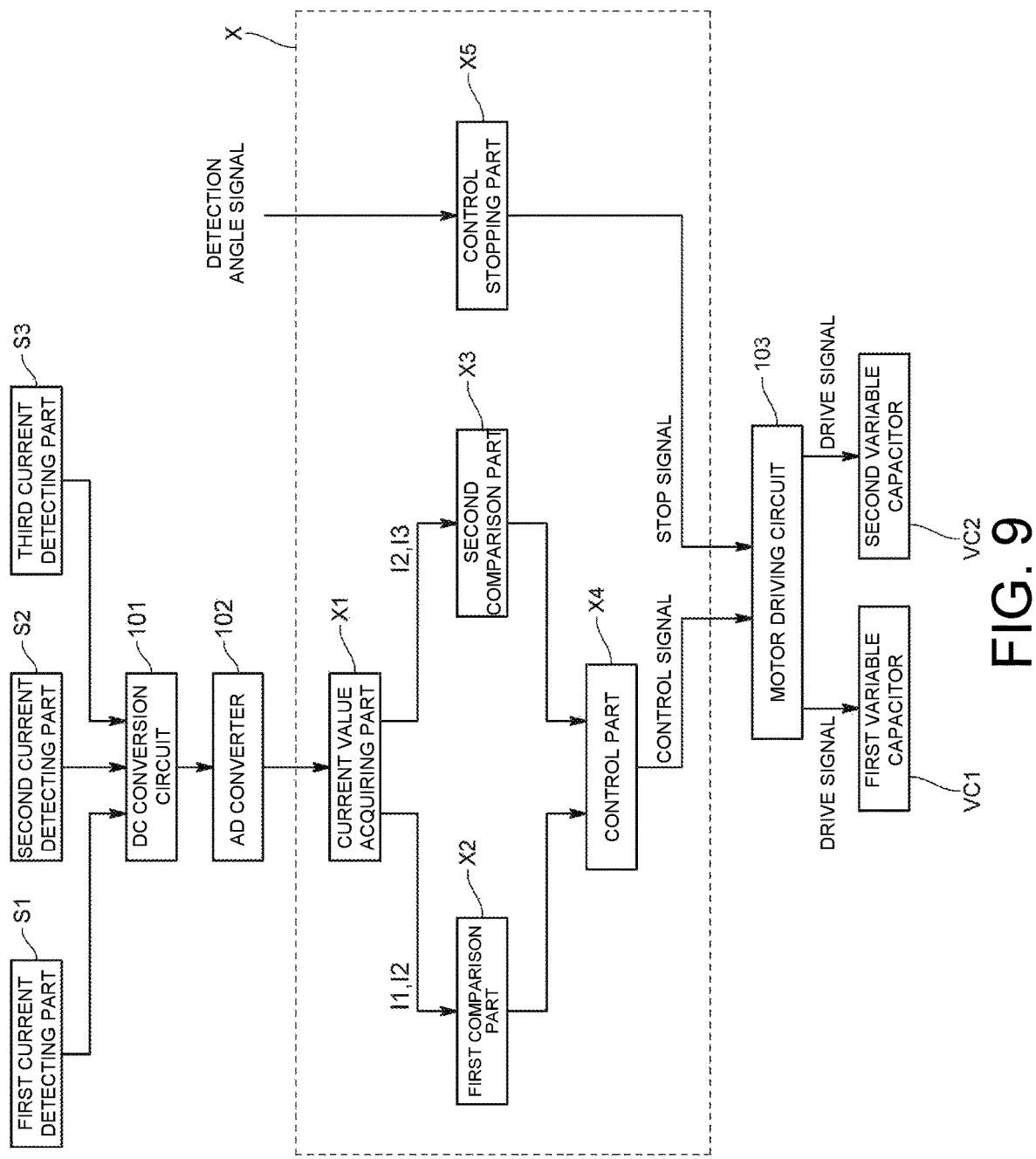
FIG. 9 is a functional block diagram illustrating functions of a control apparatus according to the embodiment.

This control apparatus X, physically, is a computer such as a PLC including a CPU, a memory, an input/output interface, and the like and, as illustrated in FIG. 9, is configured such that functions of a current value acquiring part X1, a first comparison part X2, a second comparison part X3, and a control part X4 are exhibited by devices cooperating together by executing a program stored in the memory described above.

Hereinafter, these parts will be described.

The current value acquiring part X1 obtains signals representing magnitudes of currents detected by the current detecting parts S1 to S3. More specifically, this current value acquiring part X1 acquires a digital signal representing a first current value I1 detected by the first current detecting part S1, a digital signal representing a second current value I2 detected by the second current detecting part S2, and a digital signal representing a third current value I3 detected by the third current detecting part S3. Then, the current value acquiring part X1 outputs the first current value I1 and the second current value I2 to the first comparison part X2 and outputs the second current value I2 and the third current value I3 to the second comparison part X3.

The first comparison part X2 compares the first current value I1 and the second current value I2 with each other. More specifically, the first comparison part X2 is configured to determine whether or not a first current difference ΔI1 acquired by subtracting the first current value I1 from the second current value I2 is larger than "0".

The second comparison part X3 compares the second current value I2 and the third current value I3 with each other. More specifically, the second comparison part X3 is configured to determine whether or not a second current difference ΔI2 acquired by subtracting the third current value I3 from the second current value I2 is larger than "0".

The control part X4 performs feedback control of the static capacitance of the first variable capacitor VC1 and the static capacitance of the second variable capacitor VC2 on the basis of the first current value I1, the second current value I2, and the third current value I3. More specifically, the control part X4 outputs a control signal to the motor driving circuit 103 such that the first current value I1, the second current value I2, and the third current value I3 becomes the same.

Figure 10:
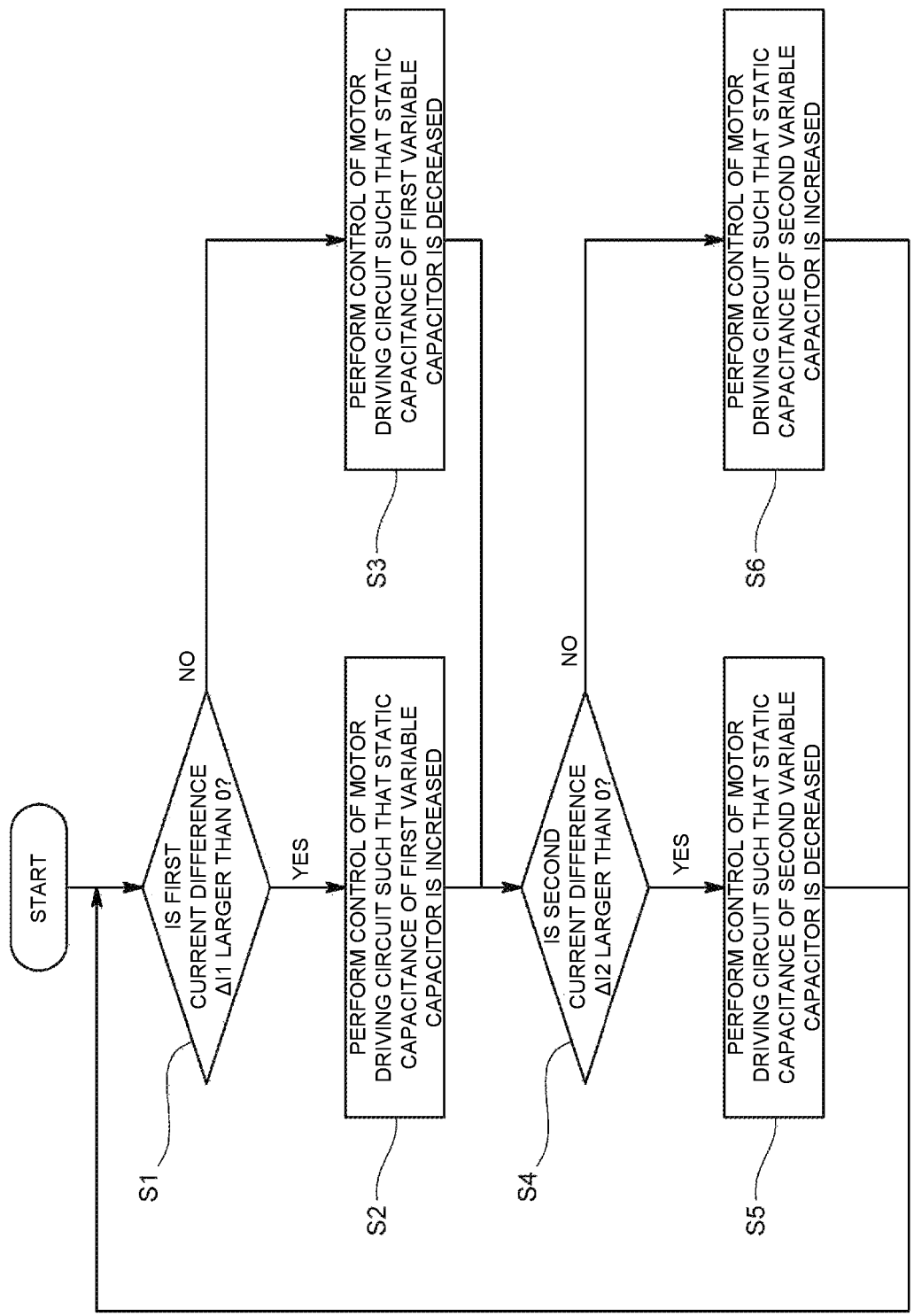
FIG. 10 is a flowchart illustrating an operation of the control apparatus according to the embodiment.

Hereinafter, more control details will be described in detail with reference to a flowchart illustrated in FIG. 10.

First, the first comparison part X2 determines whether or not the second current value I2 is larger than the first current value I1, in other words, whether the first current difference ΔI1 is larger than "0" (S1).

In a case in which it is determined that the first current difference ΔI1 is larger than "0" in S1, the control part X4 outputs a control signal to the motor driving circuit 103 such that the static capacitance of the first variable capacitor VC1 increases (S2). Then, a drive signal based on this control signal is output from the motor driving circuit 103 to the first drive part M1.

On the other hand, in S1, in a case in which it is determined that the first current difference ΔI1 is not larger than "0", in other words, in a case in which the first current difference ΔI1 is equal to or smaller than "0", the control part X4 outputs a control signal to the motor driving circuit 103 such that the static capacitance of the first variable capacitor VC1 decreases (S3). Then, a drive signal based on this control signal is output from the motor driving circuit 103 to the first drive part M1.

In a case in which the static capacitance of the first variable capacitor VC1 is changed in S2 or S3, a change in the second current value I2 is relatively small, and the first current value I2 is relatively greatly increased or decreased such that it becomes closer to the second current value I2. It is assumed that the reason for this is that it is unlikely for a current flowing between the first antenna 3A and the second antenna 3B to be influenced by the plasma more than a current flowing through the first antenna 3A.

Next, the second comparison part X3 determines whether or not the second current value I2 is larger than the third current value I1, in other words, whether or not the second current difference ΔI2 is larger than "0" (S4).

In a case in which it is determined that the second current difference ΔI2 is larger than "0" in S4, the control part X4 outputs a control signal to the motor driving circuit 103 such that the static capacitance of the second variable capacitor VC2 decreases (S5). Then, drive signal based on this control signal is output from the motor driving circuit 103 to the second drive part M2.

On the other hand, in a case in which it is determined that the second current difference ΔI2 is not larger than "0", in other words, in a case in which the second current difference ΔI2 is equal to or smaller than "0", in S4, the control part X4 outputs a control signal to the motor driving circuit 103 such that the static capacitance of the second variable capacitor VC2 increases (S6). Then, a drive signal based on this control signal is output from the motor driving circuit 103 to the second drive part M2.

In a case in which the static capacitance of the second variable capacitor VC2 is changed in S5 or S6, a change in the second current value I2 is relatively small, and the third current value I3 is greatly increased or decreased such that it becomes close to the second current value I2. It is assumed that the reason for this is that it is unlikely that a current flowing between the first antenna 3A and the second antenna 3B will be influenced by a plasma more than a current flowing through the second antenna 3B.

Hereinafter, the control part X4 repeats S1 to S6 and continuously outputs a control signal to the motor driving circuit 103 such that the first current value I1 and the second current value I2 become the same, and the second current value I2 and the third current value I3 become the same.

In addition, the control apparatus X according to this embodiment, as illustrated in FIG. 9, has a function of a control stopping part X5.

This control stopping part X5 stops rotation of the movable electrode 18 at least in a case in which a rotation angle of the movable electrode 18 of the first variable capacitor VC1 becomes a predetermined threshold.

Described in more specifically, an angle detecting part, which is not illustrated in the drawing, for example, an encoder or the like is provided in the movable electrode 18, and a detection angle signal representing a rotation angle of the movable electrode 18 is output from this angle detecting part to the control stopping part X5. Here, the rotation angle, for example, as illustrated in FIGS. 7 and 8, is a rotation angle θ in a case in which a state in which the movable metal plates 182 and 183 and the fixed metal plates 161 and 171 do not overlap each other in the plan view, in other words, a state in which the static capacitance is zero is set as 0 degrees.

The threshold described above is set to an angle in a state in which a part of each of the movable metal plates 182 and 183 overlaps a part of the first fixed metal plate 161 or the second fixed metal plate 171 in the plan view.

More specifically, the threshold is a rotation angle until the movable metal plates 182 and 183 reach a next 90 degrees after starting to overlap with the first fixed metal plate 161 and the second fixed metal plate 171 when the movable metal plates 182 and 183 are rotated from 0 degrees at which they do not overlap the fixed metal plates 161 and 171 and, for example, is 10 degrees. Here, a configuration in which the movable metal plates 182 and 183 are forwardly/reversely rotated between 0 degrees and 90 degrees is assumed. In a configuration in which the movable metal plates 182 and 183 are rotated over 90 degrees, an upper limit value and a lower limit value may be set as the threshold.

Then, in a case in which the rotation angle of the movable electrode 18 is larger than the threshold, the rotation angle of the movable electrode 18 is decreased by performing control using the control part X4 described above, and, in a case in which the rotation angle reaches the threshold, the control stopping part X5 forcibly stops the rotation of the movable electrode 18 by outputting a stop signal to the motor driving circuit 103 regardless of the determination acquired by the control part X4.

In addition, similar to the first variable capacitor VC1, the control stopping part X5 may be configured to stop the rotation of the movable electrode in a case in which the rotation angle of the movable electrode, which is not illustrated in the drawing, of the second variable capacitor VC2 becomes a predetermined threshold.

Effect of this Embodiment

In this way, according to the plasma control system 200 of this embodiment, the control part X4 outputs a control signal for performing control of the first drive part M1 and the second drive part M2 to the motor driving circuit 103 such that the first current value I1, the second current value I2, and the third current value I3 become the same, and accordingly, high frequency currents IR flowing through the first antenna 3A and the second antenna 3B can be uniformized as much as possible along the longitudinal direction.

As a result, the plasma P that is uniform along the longitudinal direction of the antennas 3 can be generated while an increase in the size of the substrate W using the long antennas 3 is able to be handled.

"The first current value I1, the second current value I2, and the third current value I3 becoming the same" described here may represent a case in which the first current difference ΔI1 and the second current difference ΔI2 described above substantially become zero, and the first current difference ΔI1 and the second current difference ΔI2 may be slightly larger or slightly smaller than zero as long as currents flowing through the first antenna 3A and the second antenna 3B can be uniformized as much as possible in the longitudinal direction.

In addition, since the control stopping part X5 stops the rotation of the movable electrode 18 in a case in which the rotation angle of the movable electrode 18 reaches the threshold, the rotation of the movable electrode 18 stops before gaps Z are formed between the movable metal plates 182 and 183 and the fixed metal plates 161 and 171 on the plan view. In accordance with this, the gaps Z described above for which arc discharge can occur during generation of the plasma P are not formed, and a damage in the first variable capacitor VC1 according to arc discharge can be prevented.

In addition, since the antenna can be cooled using the coolant CL, a plasma P can be stably generated. Furthermore, since the dielectric of the first variable capacitor VC1 is configured using the coolant CL flowing through the antenna 3, unexpected variations of the static capacitance can be inhibited while cooling the first variable capacitor VC1.

In addition, since the first fixed electrode 16 and the second fixed electrode 17 are disposed at mutually different positions around the rotation axis C, the size in the axial direction of the rotation axis C can be configured to be compact.

Furthermore, the fixed electrodes 16 and 17 respectively include a plurality of the fixed metal plates 161 and 171, and the movable electrode includes a plurality of movable metal plates 182 and 183. Therefore, a maximum value of a facing area between the electrodes can be increased without increasing the areas of the fixed metal plates 161 and 171 and the movable metal plates 182 and 183.

Second Embodiment

In a plasma control system 200 according to a second embodiment, the configuration of a control apparatus X is different from that according to the embodiment described above.

Figure 11:
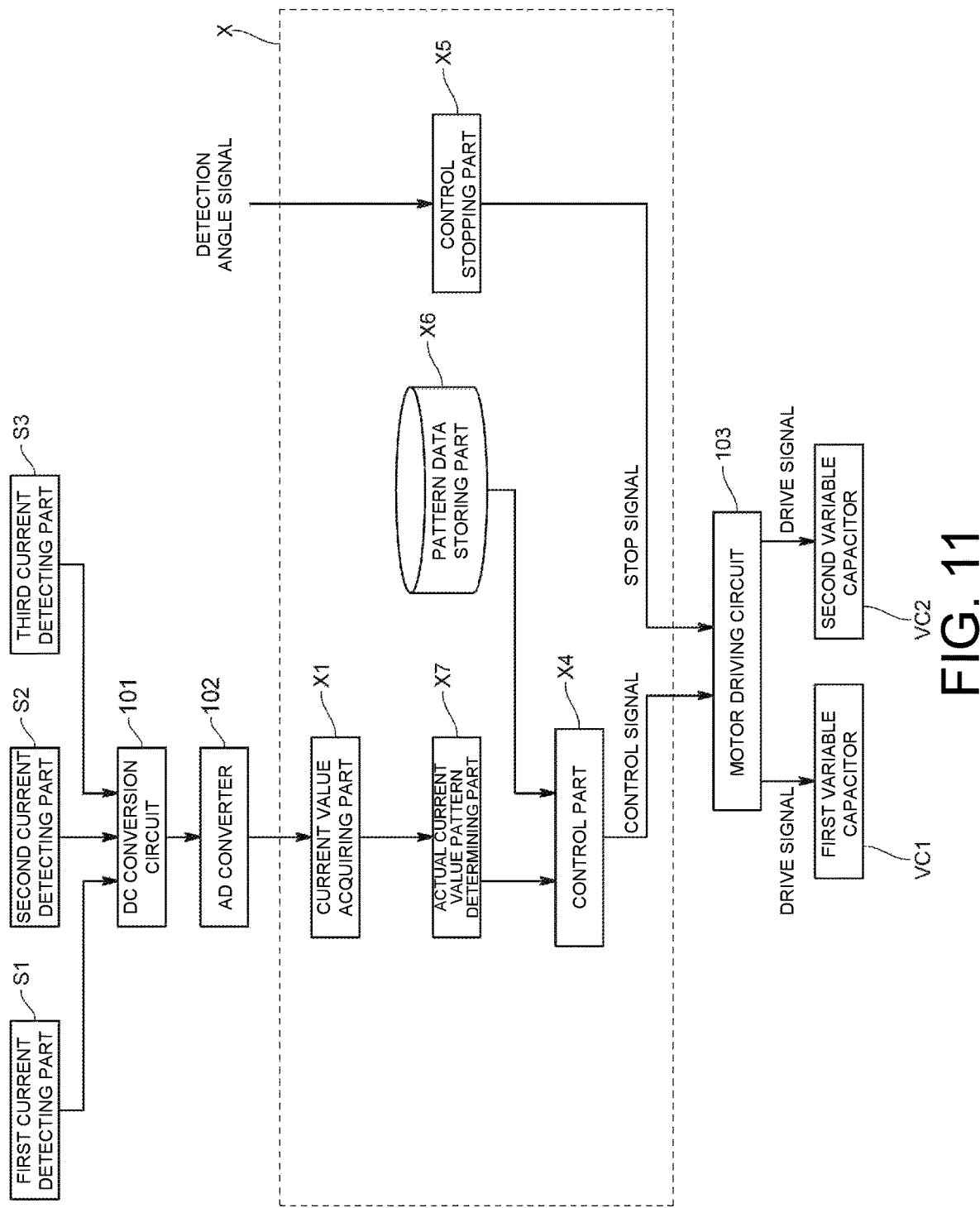
FIG. 11 is a functional block diagram illustrating functions of a control apparatus according to a second embodiment.

More specifically, the control apparatus X according to the second embodiment, as illustrated in FIG. 11, has functions of a current value acquiring part X1, a pattern data storing part X6, an actual current value pattern determining part X7, a control part X4, and a control stopping part X5.

Hereinafter, each of the parts will be described. Since the current value acquiring part X1 and the control stopping part X5 have the same functions as those according to the embodiment described above, detailed description thereof will be omitted.

The pattern data storing part X6 is set to a predetermined area of a memory configuring the control apparatus X and stores pattern data in which a plurality of types of reference current value patterns representing magnitude relations between the first current value I1, the second current value I2, and the third current value I3 and control patterns used for controlling a first drive part M1 and a second drive part M2 set in advance in correspondence with the reference current value patterns are associated with each other.

Figure 12:
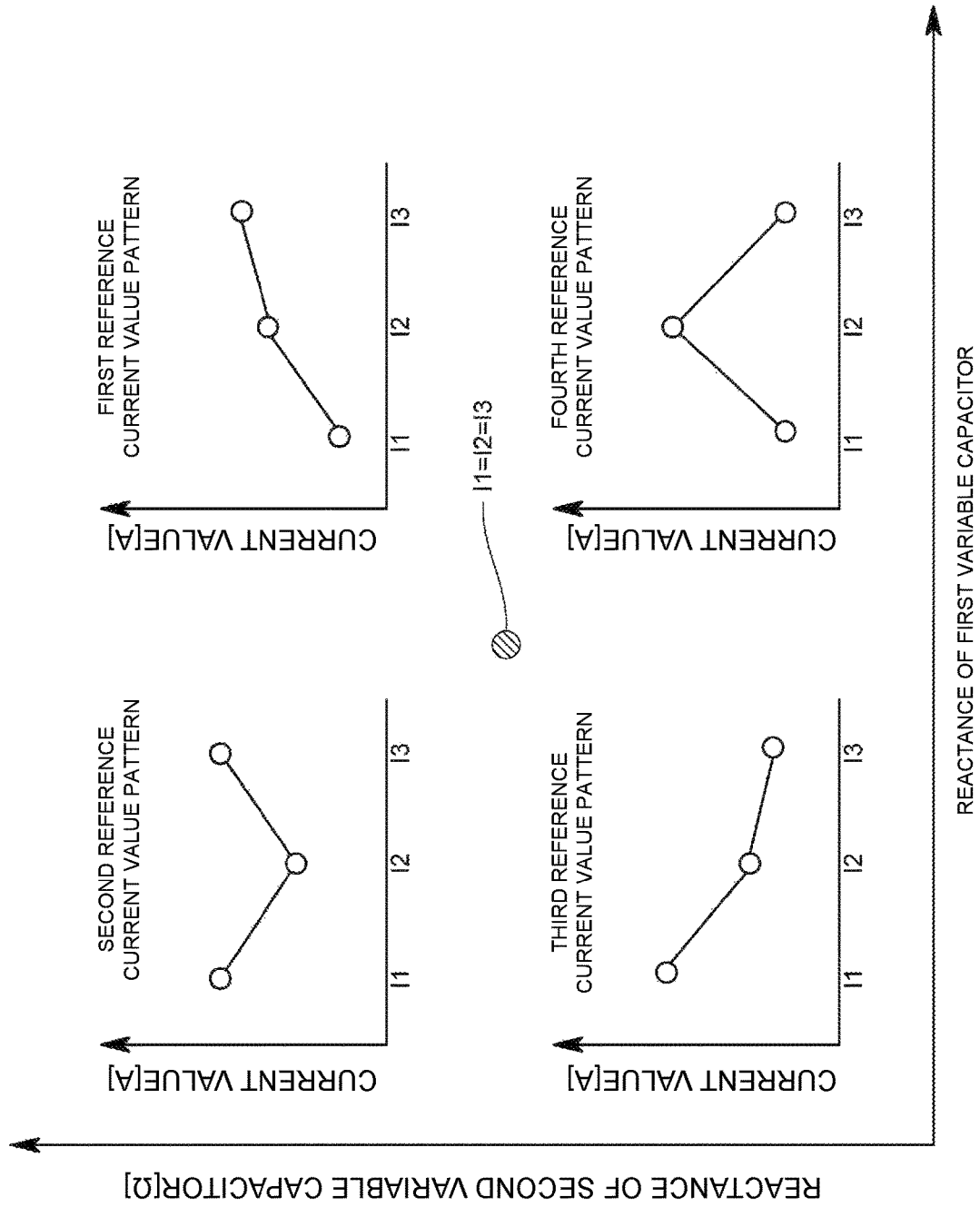
FIG. 12 is a diagram illustrating a reference current value pattern according to the second embodiment.

The plurality of types of reference current value patterns are mutually different patterns that can be assumed using magnitude relations between the first current value I1, the second current value I2, and the third current value I3 and, here, are four reference current value patterns illustrated in FIG. 12 and, more specifically, are as below.
[First reference current value pattern]
First current value I1<Second current value I2<Third current value I3
[Second reference current value pattern]
First current value I1>Second current value I2<Third current value I3
[Third reference current value pattern]
First current value I1>Second current value I2>Third current value I3
[Fourth reference current value pattern]
First current value I1<Second current value I2>Third current value I3

In addition, in consideration of a case in which the first current value I1=the second current value I2, a case in which the second current value I2=the third current value I3, and the like, the reference current value patterns may be classified into further more types.

The control patterns are acquired by setting increase/decrease directions of reactances (in other words, increase/decrease directions of static capacitances) of a first variable capacitor VC1 and a second variable capacitor VC2 required for causing the current values I1, I2, and I3 to be the same in advance for the reference current value patterns. More specifically, first to fourth control patterns for first to fourth reference current value patterns are as below.
[First Control Pattern]
The reactance of the first variable capacitor VC1 is decreased, and the reactance of the second variable capacitor VC2 is decreased. In other words, the static capacitance of the first variable capacitor VC1 is decreased, and the static capacitance of the second variable capacitor VC2 is decreased.
[Second Control Pattern]
The reactance of the first variable capacitor VC1 is increased, and the reactance of the second variable capacitor VC2 is decreased. In other words, the static capacitance of the first variable capacitor VC1 is increased, and the static capacitance of the second variable capacitor VC2 is decreased.
[Third Control Pattern]
The reactance of the first variable capacitor VC1 is increased, and the reactance of the second variable capacitor VC2 is increased. In other words, the static capacitance of the first variable capacitor VC1 is increased, and the static capacitance of the second variable capacitor VC2 is increased.
[Fourth Control Pattern]
The reactance of the first variable capacitor VC1 is decreased, and the reactance of the second variable capacitor VC2 is increased. In other words, the static capacitance of the first variable capacitor VC1 is decreased, and the static capacitance of the second variable capacitor VC2 is increased.

In addition, in each control pattern, the static capacitance of the second variable capacitor VC2 may be changed after changing the static capacitance of the first variable capacitor VC1. To the contrary, the static capacitance of the first variable capacitor VC1 may be changed after changing the static capacitance of the second variable capacitor VC2.

The actual current value pattern determining part X7 determines an actual current value pattern that is an actual magnitude relation between the first current value I1, the second current value I2, and the third current value I3 on the basis of a first current value I1, a second current value I2, and a third current value I3 output by the current value acquiring part X1.

More specifically, the actual current value pattern determining part X7 determines a magnitude relation between the first current value I1 and the second current value I2 and determines a magnitude relation between the second current value I2 and the third current value I3.

The control part X4 determines a reference current value pattern corresponding to the actual current value pattern and outputs a control signal to the motor driving circuit 103 on the basis of a control pattern associated with this reference current value pattern. Then, the motor driving circuit 103 outputs drive signals to the first drive part M1 and the second drive part M2 on the basis of this control signal.

More specifically, first, a reference current value pattern coinciding with a magnitude relation between the first current value I1, the second current value I2, and the third current value I3 is selected from among the plurality of types of reference current value patterns described above.

Then, a control signal is output to the motor driving circuit 103 such that increase/decrease directions of the static capacitances of the first variable capacitor and the second variable capacitor become increase/decrease directions represented by the control pattern associated with the selected reference current value pattern. In more detail, in a case in which the first current value I1 and the second current value I2 are different from each other, a control signal is output to the motor driving circuit 103 such that the first current value I1 approaches the second current value I2. In addition, in a case in which the second current value I2 and the third current value I3 are different from each other, a control signal is output to the motor driving circuit 103 such that the third current value I3 approaches the second current value I2.

According to the configuration described above, since a reference current value pattern coinciding with a magnitude relation of the actual current value pattern is determined, and a control signal is output to the motor driving circuit 103 on the basis of a control pattern associated with the reference current value pattern, the first current value I1, the second current value I2, and the third current value I3 can be configured to be the same.

Other Modified Embodiments

The present disclosure is not limited to each embodiment described above.

Figure 13:
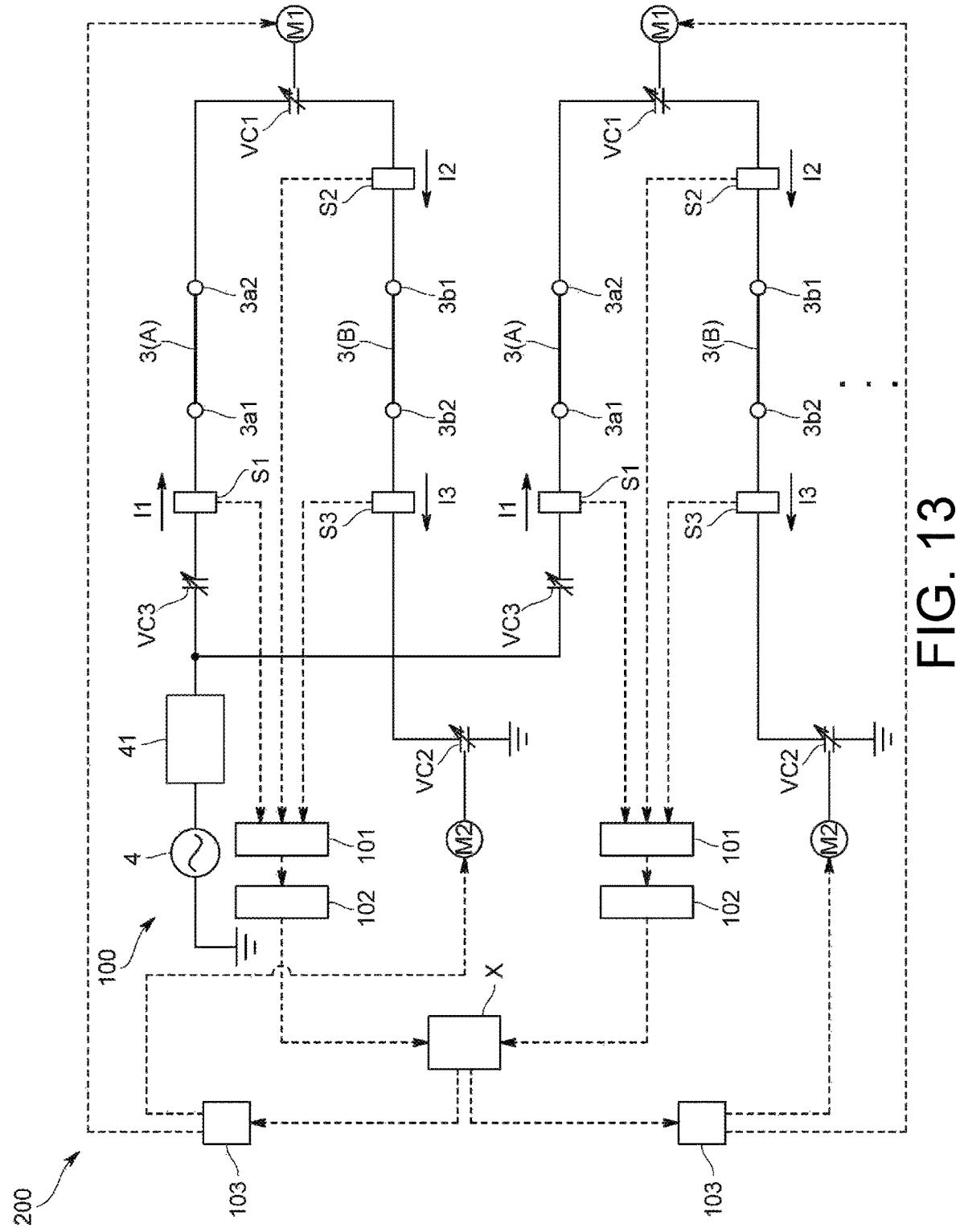
FIG. 13 is a schematic view illustrating the configurations of plasma control systems according to other embodiments.

For example, in the embodiment described above, although the plasma control system 200 includes two antennas 3, as illustrated in FIG. 13, a plurality of sets of a plurality of (for example, two) antennas 3 connected in series may be disposed in parallel. In addition, the number of antennas 3 connected in series may be three or more.

Furthermore, the plasma control system 200 illustrated in FIG. 13 further includes third variable capacitors VC3 connected to the power supply side ends 3a1 of the first antennas 3A.

According to such a configuration, similar to the embodiment described above, by performing control of the static capacitance of the first variable capacitor VC1 and the static capacitance of the second variable capacitor VC2 such that the first current value I1, the second current value I2, and the third current value I3 become the same, a plasma P that is uniform in the longitudinal direction of the first antenna 3A and the second antenna 3B can be generated.

In addition, since the first current value I1 flowing through the power supply side end 3a1 of each first antenna 3A is detected by the first current detecting part S1, a distribution proportion of the high frequency current IR for a plurality of first antennas 3A can be perceived. Thus, by changing the static capacitance of each third variable capacitor VC3 on the basis of each first current value I1, a distribution proportion of high frequency currents IR supplied to the first antennas 3A can be adjusted.

As a result, a high frequency current IR supplied from the high frequency power source 4 can be uniformly distributed to the first antennas 3A disposed in parallel while uniformizing high frequency currents IR flowing through the first antenna 3A and the second antenna 3B in the longitudinal, and a plasma P that is spatially uniform can be generated.

In the first variable capacitor according to the embodiment described above, although the movable electrode 18 is rotated around the rotation axis C, the movable electrode may be configured to slide to move in one direction. Here, as a configuration in which the movable electrode slides, a facing area may be changed by the movable electrode sliding in a direction orthogonal to a direction facing the fixed electrode, and a facing area may be changed by the movable electrode sliding in a direction facing the fixed electrode.

In such a configuration, similar to the embodiment described above, the first drive part may be a motor or may be a cylinder or the like.

In addition, also in the second variable capacitor, similarly, the movable electrode may slide to move in one direction. In such a case, a cylinder or the like may be used as the second drive part.

Instead of the first variable capacitor according to the embodiment described above, a first reactance variable element of which a reactance changes in accordance with movement of a movable element such as a variable impedance element or a variable resistor may be used.

In addition, instead of the second variable capacitor according to the embodiment described above, a second reactance variable element of which a reactance changes in accordance with movement of a movable element such as a variable impedance device or a variable resistor may be used.

In the embodiment described above, although the antennas form a linear shape, the antennas may have a curved or bent shape. In such a case, a metal pipe may have a curved or bent shape, or an insulating pipe may have a curved or bent shape.

The present disclosure is not limited to the embodiments described above, and it is apparent that various modifications can be made in a range not departing from the concept thereof.

What is claimed is:

1. A plasma control system comprising:
a high frequency power source;

a first antenna configured to have one end connected to the high frequency power source;

a second antenna configured to have one end connected to the other end of the first antenna;

a first reactance variable element configured to be disposed between the first antenna and the second antenna and have a reactance changing in accordance with movement of a movable element;

a first drive part configured to move the movable element of the first reactance variable element;

a second reactance variable element configured to be connected to the other end of the second antenna and have a reactance changing in accordance with movement of a movable element;

a second drive part configured to move the movable element of the second reactance variable element;

a first current detecting part configured to detect a current flowing through one end of the first antenna;

a second current detecting part configured to detect a current flowing between the first antenna and the second antenna;

a third current detecting part configured to detect a current flowing through the other end of the second antenna; and a control apparatus configured to output control signals used for controlling the first drive part and the second drive part such that a first current value acquired by the first current detecting part, a second current value acquired by the second current detecting part, and a third current value acquired by the third current detecting part become the same.

2. The plasma control system according to claim 1, wherein the control apparatus comprises:

a first comparison part configured to compare the first detection value with the second detection value;

a second comparison part configured to compare the second detection value with the third detection value; and a control part configured to output a control signal used for controlling the first drive part such that the first current value and the second current value become the same on the basis of a result of the comparison performed by the first comparison part and output a control signal used for controlling the second drive part such that the second current value and the third current value become the same on the basis of a result of the comparison performed by the second comparison part.

3. The plasma control system according to claim 1, wherein the control apparatus comprises:

a pattern data storing part configured to store pattern data in which a plurality of types of reference current value patterns representing magnitude relations between the first current value, the second current value, and the third current value and control patterns that are set in advance in correspondence with the reference current value patterns and are used for controlling the first drive part and the second drive part such that the current values become the same are associated with each other;

an actual current value pattern determining part configured to determine an actual current value pattern that is an actual magnitude relation between the first current value, the second current value, and the third current value; and a control part configured to determine the reference current value pattern corresponding to the actual current value pattern and output control signals used for controlling the first drive part and the second drive part on the basis of the control pattern associated with the reference current value pattern.

4. The plasma control system according to claim 1, wherein the control apparatus is configured to output a control signal used for controlling the first drive part such that the first current value approaches the second current value in a case in which the first current value and the second current value are different from each other and output a control signal used for controlling the second drive part such that the third current value approaches the second current value in a case in which the second current value and the third current value are different from each other.

5. The plasma control system according to claim 1, wherein the first reactance variable element comprises:

a first fixed electrode configured to be electrically connected to the first antenna;

a second fixed electrode configured to be electrically connected to the second antenna; and a movable electrode that is the movable element configured to form a first capacitor with the first fixed electrode and form a second capacitor with the second fixed electrode, wherein the first reactance variable element is a variable capacitor configured to be able to change a static capacitance by rotating the movable electrode around a predetermined rotation axis, and wherein the control apparatus comprises a control stopping part configured to stop rotation of the movable electrode in a case in which a rotation angle of the movable electrode becomes a predetermined threshold.

6. The plasma control system according to claim 1, wherein the first antenna and the second antenna penetrate side walls, which face each other, of a vacuum container housing a substrate and are connected in series using a connection conductor interposed between ends of the antennas on the same side, wherein each of the antennas has a flow passage through an inside of which a coolant flows, wherein the connection conductor comprises:

a first variable capacitor that is the first reactance variable element;

a first connection part configured to connect the first variable capacitor and an end of the first antenna and lead the coolant flowing out from an opening portion formed at the end to the first variable capacitor; and a second connection part configured to connect the first variable capacitor and an end of the second antenna and lead the coolant that has passed through the first variable capacitor to an opening portion formed at the end, and wherein the coolant is a dielectric of the first variable capacitor.

7. A non-transitory computer readable recording medium storing a plasma control system program that is used in a plasma control system comprising: a high frequency power source; a first antenna configured to have one end connected to the high frequency power source; a second antenna configured to have one end connected to the other end of the first antenna; a first reactance variable element configured to be disposed between the first antenna and the second antenna and have a reactance changing in accordance with movement of a movable element; a first drive part configured to move the movable element of the first reactance variable element; a second reactance variable element configured to be connected to the other end of the second antenna and have a reactance changing in accordance with movement of a movable element; a second drive part configured to move the movable element of the second reactance variable element; a first current detecting part configured to detect a current flowing through one end of the first antenna; a second current detecting part configured to detect a current flowing between the first antenna and the second antenna; and a third current detecting part configured to detect a current flowing through the other end of the second antenna and cause a computer to exhibit a function of outputting control signals used for controlling the first drive part and the second drive part such that a first current value acquired by the first current detecting part, a second current value acquired by the second current detecting part, and a third current value acquired by the third current detecting part become the same.

* * * * *